(12) United States Patent
Hirabayashi et al.

(10) Patent No.: US 10,241,392 B2
(45) Date of Patent: Mar. 26, 2019

(54) GLASS SUBSTRATE FOR MASK BLANK, AND METHOD FOR PRODUCING THE SAME

(71) Applicant: AGC Inc., Chiyoda-ku (JP)

(72) Inventors: Yusuke Hirabayashi, Tokyo (JP); Yuzo Okamura, Tokyo (JP); Naohiro Umeo, Fukushima (JP)

(73) Assignee: AGC Inc., Chiyoda-ku (JP)

( * ) Notice: Subject to any disclaimer, the term of this patent is extended or adjusted under 35 U.S.C. 154(b) by 262 days.

(21) Appl. No.: 14/989,232

(22) Filed: Jan. 6, 2016

(65) Prior Publication Data

US 2016/0209742 A1 Jul. 21, 2016

(30) Foreign Application Priority Data

Jan. 20, 2015 (JP) .................. 2015-008498

(51) Int. Cl.
- *B32B 3/10* (2006.01)
- *G03F 1/60* (2012.01)
- *B24B 37/20* (2012.01)

(52) U.S. Cl.
CPC ................ *G03F 1/60* (2013.01); *B24B 37/20* (2013.01)

(58) Field of Classification Search
None
See application file for complete search history.

(56) References Cited

U.S. PATENT DOCUMENTS

2002/0179576 A1* 12/2002 Takeuchi ................ C03C 15/00
219/121.41
2010/0190414 A1 7/2010 Harada et al.

FOREIGN PATENT DOCUMENTS

JP 2011-207757 10/2011
JP 5402391 1/2014

* cited by examiner

*Primary Examiner* — Christopher M Polley
(74) *Attorney, Agent, or Firm* — Oblon, McClelland, Maier & Neustadt, L.L.P.

(57) ABSTRACT

A glass substrate for a mask blank includes two main surfaces facing each other and surfaces to be chamfered. The surfaces to be chamfered are provided peripherally around the two main surfaces. A flatness of one of the main surfaces is 100 nm or less. On the surface to be chamfered from which substrate corner parts are excluded, each of the substrate corner part being portions where a distance from an outer end of a two-dimensional projection profile of the one of the main surfaces and the surface to be chamfered is within 10 mm, a waviness measured in a range of 2 mm at an arbitrary part in a direction parallel to one side closest to the surface to be chamfered in the two-dimensional projection profile is 50 nm or less.

15 Claims, 1 Drawing Sheet

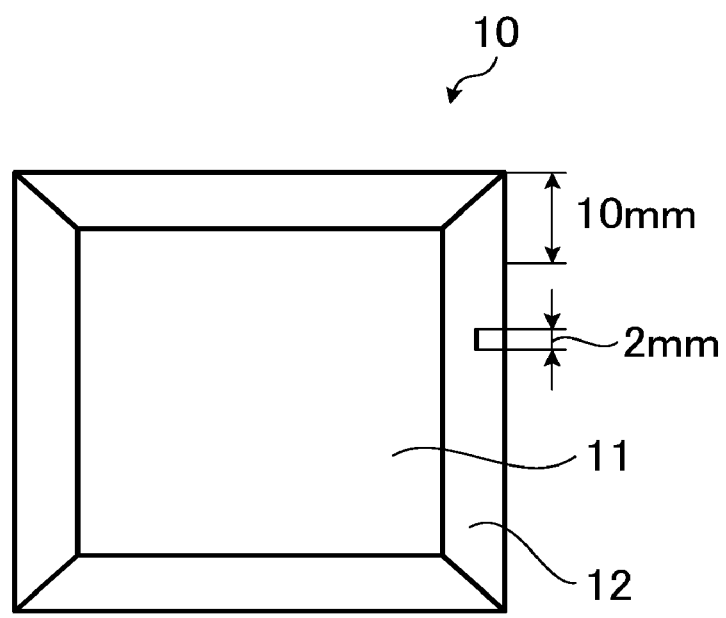

GLASS SUBSTRATE FOR MASK BLANK, AND METHOD FOR PRODUCING THE SAME

CROSS-REFERENCE TO RELATED APPLICATIONS

This application claims priority from Japanese Patent Application No. 2015-008498 filed on Jan. 20, 2015, the entire subject matter of which is incorporated herein by reference.

BACKGROUND OF THE INVENTION

Technical Field

An aspect of the present invention relates to a glass substrate for mask blanks for use in various kinds of lithography, and to its production method.

The glass substrate for mask blanks in an aspect of the present invention is favorable for a glass substrate for mask blanks to be used in lithography using EUV (extreme ultra violet) light (hereinafter abbreviated as "EUVL") (hereinafter this is abbreviated as "glass substrate for EUVL mask blank").

The glass substrate for mask blanks in an aspect of the present invention is also favorable for a glass substrate for mask blanks for use in lithography using an already-existing transmission optical system, for example, for a glass substrate for mask blanks for lithography using an ArF excimer laser or a KrF excimer laser.

Background Art

With the recent tendency toward high-density and high-precision ultra-LSI devices, the specifications required for the surface of the glass substrate for mask blanks for use in various kinds of lithography are becoming severer year by year. In particular, with the wavelength of the light from the exposing source being shorter, the requirements for the profile accuracy (flatness) of the substrate surface and for the absence of the defects (particles, scratches, pits, etc.) in the surface are becoming severer, and a glass substrate having an extremely high degree of flatness and having few micro-defects is desired.

For example, in a case of immersion lithography using an ArF excimer laser as the light from an exposing source, the necessary flatness of the glass substrate surface for mask blanks is 100 nm or less and the necessary defect size in the glass substrate is 70 nm or less; and further in a case of a glass substrate for EUVL mask blanks, the necessary flatness of the glass substrate surface is 30 nm or less as the PV value, and the necessary defect size is 50 nm or less.

To attain the above-mentioned high-level flatness, local processing of planarizing the surface of a glass substrate for mask blanks while locally controlling the processing level in accordance with the local protrusions in the substrate is employed. For the local processing method, plasma etching, gas cluster ion beam etching, a local processing tool using a magnetic fluid or a local processing tool using a rotary small-size processing tool is preferably used (see Patent Documents 1 and 2).

However, in the case where such a local processing tool is used for processing the surface of a glass substrate for mask blanks, scanning is necessary to be conducted by moving the local processing tool on the substrate thereof for processing the entire surface of the glass substrate for mask blanks. The scanning pitch interval with the above-mentioned local processing tool is typically from 0.1 to 1 mm, and in the part processed with the local processing tool, there may remain a periodical processing trace corresponding to the scanning pitch interval. For removing the processing trace, the entire surface of the glass substrate for mask blanks must be subjected to final polishing using a polishing pad and a polishing slurry.

On the other hand, in general, the circumference part of the surface of a glass substrate for mask blanks is provided with a surface to be chamfered for the reason of preventing cracking or chipping.

The above-mentioned requirements for flatness and defect size relate to the main surface excepting the circumference part provided with a surface to be chamfered in the surface of a glass substrate for mask blanks.

Patent Document 1: JP-A-2011-207757
Patent Document 2: Japanese Patent No. 5402391

SUMMARY OF THE INVENTION

In the case where the above-mentioned local processing is employed in processing the main surface of a glass substrate for mask blanks, the surface to be chamfered in the glass substrate for mask blanks positioned at the periphery of the main surface thereof is also locally processed. As a result, the surface to be chamfered in the glass substrate for mask blanks may also be given a periodical processing trace corresponding to the above-mentioned scanning pitch interval. The processing trace on the main surface could be removed by the subsequent final polishing, but the processing trace would still remain on the surface to be chamfered.

When measuring the flatness in the main surface of a glass substrate for mask blanks after final polishing, in general, the surface to be chamfered in the glass substrate for mask blanks is held with a holder, but when a processing trace exists in the surface to be chamfered which is held by a holder, the measurement accuracy for the flatness of the main surface of the glass substrate for mask blanks may lower.

For solving the above-mentioned problems in the related art, an object of an aspect of the present invention is to provide a glass substrate for a mask blank in which the measurement accuracy for the flatness of the main surface is high, and a method for producing it.

In order to solve the above problems, an aspect of the present invention provides a glass substrate for a mask blank, including two main surfaces facing each other and surfaces to be chamfered, the surfaces to be chamfered being provided peripherally around the two main surfaces, wherein a flatness of one of the main surfaces is 100 nm or less, and on the surface to be chamfered from which substrate corner parts are excluded, each of the substrate corner part being portions where a distance from an outer end of a two-dimensional projection profile of the one of the main surfaces and the surface to be chamfered which is provided peripherally around the one of the main surfaces is within 10 mm, a waviness measured in a range of 2 mm at an arbitrary part in a direction parallel to one side closest to the surface to be chamfered in the two-dimensional projection profile is 50 nm or less.

In addition, an aspect of the present invention provides a glass substrate for a mask blank, including two main surfaces facing each other and surfaces to be chamfered, the substrates to be chamfered being provided peripherally around the two main surfaces, wherein a flatness of each of the two main surfaces is 100 nm or less, on the surfaces to be chamfered from which substrate corner parts are excluded, each of the substrate corner parts being portions where a distance from an outer end of a two-dimensional projection profile of the main surfaces and the surfaces to be chamfered which are provided peripherally around the main surfaces is within 10 mm, a waviness measured in a range of 2 mm at an arbitrary part in a direction parallel to one side closest to the surface to be chamfered in the two-dimensional projection profile is 50 nm or less.

In addition, an aspect of the present invention provides a method for producing a glass substrate for a mask blank, the glass substrate including a main surface and a surface to be chamfered, the surface to be chamfered being provided peripherally around the main surface, the method including:

scanning the main surface of the glass substrate by moving a local processing tool whose unit processing area is smaller than an area of the main surface of the glass substrate, thereby processing the main surface; and thereafter polishing the surface to be chamfered being provided peripherally around the main surface so that a polishing amount is 200 nm or more; and polishing the main surface by using a polishing pad whose contact area in polishing is larger than the area of the main surface and a polishing slurry so that a polishing amount is 200 nm or more and 2000 nm or less.

According to an aspect of the present invention, the measurement accuracy for the flatness of the main surface of a glass substrate for a mask blank can be improved.

BRIEF DESCRIPTION OF THE DRAWINGS

FIG. 1 is a plan view of a glass substrate including surfaces to be chamfered.

DETAILED DESCRIPTION OF THE INVENTION

An aspect of the present invention is described with reference to the drawing hereinbelow.

The glass substrate for mask blanks in an aspect of the present invention includes two main surfaces facing each other and includes surfaces to be chamfered being provided peripherally around the main surfaces.

FIG. 1 is a plan view of a glass substrate including surfaces to be chamfered, in which one main surface 11 of the glass substrate 10 and the surfaces to be chamfered 12 being provided around the main surface 11 are shown as a two-dimensional projection profile thereof. The two-dimensional projection profile of the other main surface facing the main surface 11 and the surfaces to be chamfered being provided around the other main surface is the same profile as in FIG. 1.

The width of the surface to be chamfered 12 may differ depending on the specifications of the glass substrate, and in a case of a glass substrate having a size of 152 mm square for use as a glass substrate for mask blanks, the width may be from 0.2 to 0.6 mm.

The glass substrate for mask blanks in an aspect of the present invention is used in various kinds of lithography, and therefore the main surface thereof is required to have high flatness.

In a case where the glass substrate for mask blanks in an aspect of the present invention is used in lithography using a transmission optical system, the flatness of the main surface on the side to be the exposure side is required to be high. In this case, the flatness of one main surface of the glass substrate for mask blanks in an aspect of the present invention is 100 nm or less, preferably 50 nm or less, more preferably 30 nm or less.

On the other hand, in a case where the glass substrate is used in EUVL, not only the main surface on the side to be the exposure side but also the other main surface on the back side relative to the one main surface is also required to have high flatness. In this case, the flatness of the two main surface of the glass substrate for mask blanks in an aspect of the present invention is individually 100 nm or less, preferably 50 nm or less, more preferably 30 nm or less.

In an aspect of the present invention, the portions where a distance from the outer end of the two-dimensional projection profile of the main surface 11 and the surfaces to be chamfered 12, as shown in FIG. 1, is within 10 mm are referred to as a substrate corner part of the glass substrate 10.

In the portions excepting the above-defined substrate corner parts in the surface to be chamfered 12 in the glass substrate for mask blanks in an aspect of the present invention, the waviness measured in a range of 2 mm at an arbitrary part in the direction parallel to one side closest to the surface to be chamfered 12 in the two-dimensional projection profile (for example, in the case of the surface to be chamfered 12 being located at the right side of the main surface 11 in FIG. 1, the right side of the shown two-dimensional projection profile) is 50 nm or less.

In a case where the glass substrate for mask blanks in an aspect of the present invention is used in lithography using a transmission optical system, the above-defined waviness in the surfaces to be chambered in the above-mentioned one main surface is 50 nm or less.

On the other hand, in a case where the glass substrate is used in EUVL, the above-defined waviness in the surfaces to be chambered in the above-mentioned two main surfaces is 50 nm or less.

The reasons why the substrate corner parts are excluded from the surface to be chamfered 12 is that the flatness in the substrate corner parts is often low as compared with that in the remaining part of the surface to be chamfered 12, and when measuring the flatness of the main surface 11 of a glass substrate for mask blanks, in general, the part excepting the substrate corner parts in the surface to be chambered 12 in the glass substrate for mask blanks is held by a holder.

In a range of 2 mm at an arbitrary part in the direction parallel to one side closest to the surface to be chamfered 12 in the two-dimensional projection profile, the waviness is measured for the following reasons.

As described above, the scanning pitch interval of the local processing tool for use for final polishing of the main surface 11 of the glass substrate 10 is typically from 0.1 to 1 mm, and in the part processed with the local processing tool, there may remain a periodical processing trace corresponding to the scanning pitch interval. When the waviness is measured in a range of 2 mm at an arbitrary part, the range being significantly longer than the period of the processing trace made by the local processing tool, it would be sufficient to evaluate the influence of the processing trace by the local processing tool.

In addition, when measuring the flatness, the contact part between the glass substrate and the holder to hold the glass substrate has a shape longer in the direction parallel to one side closest to the surface to be chamfered 12 in the two-dimensional projection profile than in the direction perpendicular thereto. The influence of the flatness on the measurement accuracy is larger in the longitudinal direction of the contact part, and therefore the waviness is measured in a range of 2 mm at an arbitrary part in the direction parallel to one side closest to the surface to be chamfered 12 in the two-dimensional projection profile.

As shown in FIG. 1, there exit four surfaces to be chamfered 12 around one main surface 11 of the glass substrate 10. There also exist four surfaces to be chamfered around the other main surface of the glass substrate 10. Accordingly, in the glass substrate, there exit eight surfaces to be chamfered. In an aspect of the present invention, in all these eight surfaces to be chamfered, the waviness in a range of 2 mm at an arbitrary part in the direction parallel to one side closest to the surface to be chamfered in the two-dimensional projection profile may be measured. However, from the measurement result of the waviness in any one surface to be chamfered of four surfaces to be chamfered 12 around one main surface 11, the waviness in the remaining three surfaces to be chamfered could be estimated. This is because, in the case of processing the main surface 11 of the glass substrate 10 with a local processing tool, the scanning is conducted by moving the local processing tool on the main surface 11, and therefore, in the four surfaces to be chamfered 12 around the main surface 11, there may remain almost the same processing trace. For final polishing of two main surfaces of a glass substrate, in general, the same local processing tool is used and the glass substrate is polished under the same polishing condition. In such a case, from the measurement result of the waviness in one surface to be chamfered, the waviness in the remaining seven surfaces to be chamfered could be estimated.

In the glass substrate for mask blanks in an aspect of the present invention, the waviness measured in a range of 2 mm at an arbitrary part in the direction parallel to one side closest to the surface to be chamfered in the two-dimensional projection profile is 50 nm or less, and therefore in a case where the flatness of the main surface of the glass substrate for mask blanks is measured while holding the surface to be chamfered with a holder, the measurement accuracy increases. The reason is as follows.

When measuring the flatness of the glass substrate where the above-defined waviness is 50 nm or less, the contact area between the glass substrate and the holder to hold the glass substrate is large and therefore the holding condition can be stabilized, as compared with the case of using a substrate where the waviness is more than 50 nm. When the holding condition is stable, the flatness measurement is hardly influenced by vibration or airstream disturbance and therefore the measurement accuracy for flatness increases.

In a case where flatness measurement is repeated in plural times for the one glass substrate, the substrate could not always be held absolutely in the same position every time and the position at which the glass substrate is held may be difference. For a substrate in which the above-mentioned waviness is 50 nm or less, the holding condition thereof does not substantially vary even though the position at which the glass substrate is held is different, and therefore in the case, when the flatness of the substrate is measured repeatedly plural times, the flatness measurement reproducibility is good. On the other hand, in the case of a glass substrate where the above-defined waviness is more than 50 nm, the holding condition of the substrate varies depending on the position at which the substrate is held and the substrate therefore deforms. As a result, the flatness measurement reproducibility is lost.

Preferably, the glass constituting the glass substrate for mask blanks in an aspect of the present invention has a small coefficient of thermal expansion and the fluctuation of the coefficient of thermal expansion thereof is small. Concretely, low-thermal expansion glass having an absolute value of a coefficient of thermal expansion at 20° C. of 600 ppb/° C. is preferable, ultra-low-thermal expansion glass having a coefficient of thermal expansion at 20° C. of 400 ppb/° C. is more preferable, ultra-low-thermal expansion glass having a coefficient of thermal expansion at 20° C. of 100 ppb/° C. is even more preferable, and one having 30 ppb/° C. is still more preferable.

As the above-mentioned low-thermal expansion glass and ultra-low-thermal expansion glass, glass mainly containing $SiO_2$, typically synthetic quartz glass is usable. Concretely, examples thereof include synthetic quartz glass, AQ series (synthetic quartz glass manufactured by Asahi Glass Company, Ltd.), synthetic quartz glass mainly containing $SiO_2$ and containing from 1 to 12% by mass of $TiO_2$, and AZ (Zero-expansion glass manufactured by Asahi Glass Company, Ltd.).

The glass substrate for mask blanks in an aspect of the present invention having the characteristic features mentioned above can be produce according to the following process.

In general, in a production process for glass substrates for mask blanks, the main surface of the glass substrate is pre-polished plural times, and then finally polished. During the pre-polishing, the glass substrate is roughly polished to have a predetermined thickness, then polished at the end face and chamfered, and further, both the main surfaces are pre-polished so that the surface roughness and the flatness thereof could be not more than a predetermined value. The pre-polishing is carried out plural times, for example, two or three times. A conventional method may be employed for the pre-polishing. For example, plural double-sided lapping devices are connected in series, and a glass substrate is sequentially polished in the polishing apparatus while the polishing agent to be used and the polishing condition are changed, whereby the main surface of the glass substrate is pre-polished so as to have a predetermined surface roughness and a predetermined flatness.

Also in an aspect of the present invention, it is desirable that the main surface of the glass substrate is pre-polished so as to have a predetermined surface roughness and a predetermined flatness. It is desirable that the main surface of the glass substrate is pre-polished so that the flatness (PV value) thereof could be 1 μm or less, more preferably 500 nm or less.

Next, using a local processing tool whose unit processing area is smaller than the area of the main surface of the glass substrate, the main surface of the glass substrate is processed.

Since the unit processing area of the local processing tool is smaller than the area of the main surface of the glass substrate, the scanning is conducted by moving local processing tool on the main surface of the glass substrate for the purpose of processing the entire main surface of the glass substrate.

Regarding the local processing tool for use for the above-mentioned purpose, as the processing method, examples thereof include an ion beam etching method, a gas cluster ion beam (GOB) etching method, a plasma etching method, a wet etching method, a polishing method using a magnetic fluid (MRF: registered trademark). As the local processing tool, a rotary small-size processing tool is also usable.

Ion beam etching, gas cluster ion beam etching and plasma etching each are a method of irradiating the main surface of a glass substrate with beams, in which scanning is conducted by moving beams on the main surface of a glass substrate. As a method of beam scanning, examples thereof include luster scanning and spiral scanning, and any of scanning methods is employable here.

The polishing method with a magnetic fluid (MRF: registered trademark) is a method of polishing a site to be polished of an object, using a magnetic fluid containing polishing particles, and is described in, for example, JP-A-2010-82746 and Japanese Patent No. 4761901. The polishing apparatus using the MRF (registered trademark) polishing method and the polishing procedure of the polishing apparatus are exemplified in JP-A-2010-82746.

The processing method using a rotary small-size processing tool is a method where a polish-processing part that rotates by a motor is brought into contact with a site to be processed of an object so as to polish-process the part of the object.

The rotary small-size processing tool may be any one in which the polish-processing part is a rotor capable of polishing an object, and examples thereof include a system where a small-size surface plate is pressed against the substrate to be polished, just vertically from the top thereof and the surface plate is thus rotated around the axis vertical to the substrate surface under pressure, a system where a rotary processing tool fixed to a small-size grinder is pressed against the substrate surface to be polished in an oblique direction thereto, and the like.

Next, the surfaces to be chamfered which is provided around the main surface are polished so that the polishing amount could be 200 nm or more.

As described above, when a main surface of a glass substrate is polished using a local processing tool, there may remain a periodical processing trace corresponding to the scanning pitch interval of the local processing tool, in the surfaces to be chamfered which is positioned around the main surface in the glass substrate. The scanning pitch interval of the local processing tool is typically from 0.1 to 1 mm, and the depth of the processing trace is typically from 50 to 100 nm or so. By polishing the surfaces to be chamfered so that the polishing amount could be 200 nm or more, the processing trace remaining on the surfaces to be chamfered can be removed.

The polishing amount of the surfaces to be chamfered is preferably 200 nm or more, more preferably 500 nm or more, and even more preferably 1000 nm or more.

The polishing method to be used for polishing surfaces to be chamfered is not specifically defined so far as any new waviness larger than 50 nm would not be generated by the polishing itself, and may be selected from any known polishing methods. Specific examples of the polishing method applicable to polishing of surfaces to be chamfered are as follows.

Examples thereof the polishing method include polishing using loose grains of silica, ceria, alumina, zirconia or the like and a polishing pad, polishing using the above-mentioned loose grains and a brush, and polishing using a polishing tape prepared by fixing silica, ceria, alumina, zirconia or the like on the surface of a film-shaped sheet.

Next, using a polishing pad whose contact area in polishing is larger than the area of the main surface, and a polishing slurry, the main surface of the glass substrate is polished so that the polishing amount could be 200 nm or more and 2000 nm or less. Here, a polishing pad whose contact area in polishing is larger than the area of the main surface is used for the purpose of polishing the entire main surface of the glass substrate at once. So far as the total polishing amount falls within the above-mentioned range, the polishing may be carried out in plural times.

The polishing amount is to be 200 nm or more, and this is for removing the processing trace by the local processing tool, like that described for polishing surfaces to be chamfered. On the other hand, the upper limit is defined to be 2000 nm, and this is because, even when the polishing amount is larger than the limit, such would not contribute to the removal of the processing trace by the local processing tool but the time necessary for the polishing would increase and the productivity may worsen or the performance of controlling the flatness may worsen so that the production yield of the substrate for a mask blank would lower.

The polishing amount of the main surface is preferably 200 nm or more and 2000 nm or less, more preferably 200 nm or more and 1000 nm or less, even more preferably 200 nm or more and 500 nm or less.

As the polishing pad for use in polishing the main surface of a glass substrate for mask blanks, examples thereof include a polishing pad having a polyurethane resin foam layer, which is prepared by infiltrating a polyurethane resin into a base fabric such as a nonwoven fabric or the like and solidifying it in wet, etc. As the polishing pad, preferable examples thereof include a swede polishing pad. For the swede polishing pad, a soft resin foam having a suitable compression modulus is preferably used, and specific examples thereof include an ether-based resin foam, ester-based resin foam, carbonate-based resin foam or the like.

The polishing slurry for use for polishing the main surface of a glass substrate for mask blanks contains polishing particles and a dispersion medium for the grains. Colloidal silica, cerium oxide and the like are preferred. Colloidal silica is more preferred as capable of polishing glass substrate more finely.

As the dispersion medium for polishing particles, examples thereof include water and an organic solvent, and water is preferred.

EXAMPLES

An aspect of the present invention is described in detail by Examples hereinunder.

In the Examples, the following process was carried out.

A synthetic quartz glass substrate having a size of 152 mm square and a thickness of 6.6 mm was prepared. Of the synthetic quartz glass substrate, the size of the main surfaces is 151.2 mm square and the width of the surfaces to be chamfered is 0.4 mm.

Using a double-sided lapping device, the main surfaces of the synthetic quartz glass substrate were pre-polished so that the flatness (PV value) of the main surfaces could be 1 μm or less.

Next, the main surfaces of the synthetic quartz glass substrate were processed using GOB etching as a local processing tool The beam diameter of GCIB was 6 mm as the FWHM value, and the scanning was conducted by moving the beams applied to the main surfaces, thereby entirely polishing the main surfaces.

Next, in Examples 1 to 3, the surfaces to be chamfered in the synthetic quartz glass substrate were polished. For polishing the surfaces to be chamfered, loose ceria grains and a polishing pad were used. The polishing amount was 200 nm.

On the other hand, in Comparative Examples 1 to 3, the surfaces to be chamfered were not polished.

Next, using a soft polyurethane-made polishing pad whose pad diameter is larger than 152 mm, and using colloidal silica as a polishing slurry, the main surfaces of the synthetic quartz glass substrate were polished. The polishing amount was 200 nm.

In the synthetic quartz glass substrate processed according to the above-mentioned method, the waviness was measured using a scanning white interferometer manufactured by ZYGO Corporation, in the range of 2 mm of the surface to be chamfered excepting the substrate corner parts, as shown in FIG. 1.

Next, the surfaces to be chamfered in the synthetic quartz glass substrate were held with a holder, and then, the flatness of the main surfaces of the synthetic quartz glass substrate was measured using a laser interferometer manufactured by FUJIFILM Corporation. The measurement of the flatness of the main surfaces was carried out 10 times in every one synthetic quartz glass substrate. The results are shown in the following Table.

TABLE 1

|  |  | Example 1 | Example 2 | Example 3 | Comparative Example 1 | Comparative Example 2 | Comparative Example 3 |
|---|---|---|---|---|---|---|---|
| Polishing of surfaces to be chamfered | | Yes | Yes | Yes | No | No | No |
| Waviness in surfaces to be chamfered [nm] | | 20 | 16 | 33 | 64 | 71 | 66 |
| Measured values of flatness [nm] | 1st time | 49 | 49 | 72 | 45 | 47 | 64 |
| | 2nd time | 41 | 51 | 71 | 48 | 53 | 77 |
| | 3rd time | 43 | 51 | 67 | 77 | 95 | 69 |
| | 4th time | 47 | 47 | 65 | 57 | 57 | 67 |
| | 5th time | 41 | 54 | 68 | 58 | 46 | 65 |
| | 6th time | 47 | 57 | 69 | 53 | 44 | 89 |
| | 7th time | 40 | 57 | 70 | 60 | 55 | 82 |
| | 8th time | 43 | 56 | 66 | 80 | 53 | 66 |
| | 9th time | 41 | 47 | 71 | 50 | 50 | 58 |
| | 10th time | 47 | 51 | 66 | 53 | 52 | 69 |
| | Standard Deviation | 3.3 | 3.8 | 2.5 | 11.7 | 14.6 | 9.3 |
| | Maximum | 49 | 57 | 72 | 80 | 95 | 89 |
| | Median + 8 | 51 | 59 | 76.5 | 63 | 60.5 | 76 |
| | Median | 43 | 51 | 68.5 | 55 | 52.5 | 68 |
| | Median − 8 | 35 | 43 | 60.5 | 47 | 44.5 | 60 |
| | Minimum | 40 | 47 | 65 | 45 | 44 | 58 |

In Examples 1 to 3 where the surfaces to be chamfered were polished after the main surfaces were processed with the local processing tool, the fluctuation in the measured values of flatness with respect to the main surface was small. On the other hand, in Comparative Examples 1 to 3 where the surfaces to be chamfered were not polished after the main surfaces were processed with the local processing tool, the fluctuation in the measured values of flatness with respect to the main surface was large. This point can be confirmed from the numerical values of standard deviation.

In addition, from the results in Examples 1 to 3, the measurement fluctuation in the device used for measurement of the flatness of the main surfaces (standard deviation, σ) is considered to be about 4 nm. With that, in the case where all the measured values of flatness are within the range of the median of the measured values of flatness ±2σ (8 nm), it is considered that the measurement accuracy of the flatness of the main surfaces could be high. On the other hand, in the case where some of the measured values of flatness are outside the range of the median of the measured values of flatness ±2σ (8 nm), it is considered that the measurement accuracy of the flatness of the main surfaces would be low.

In Examples 1 to 3, all the measured values of flatness are within the range of the median of the measured values of flatness ±2σ (8 nm), and the measurement accuracy of the flatness of the main surfaces is high.

REFERENCE SIGNS LIST

10: Glass Substrate
11: Main Surface
12: Surfaces to be Chamfered

What is claimed is:

1. A glass substrate for a mask blank, comprising two main surfaces facing each other and chamfered surfaces provided at peripheries of the two main surfaces, wherein
a flatness of at least one of the main surfaces is 100 nm or less, and
on the chamfered surfaces surrounding the at least one of the main surfaces and being other than corner portions which are 10 mm or less apart from outer corners of the chamfered surface in a plan view of the glass substrate, a waviness measured along a line segment having a length of 2 mm in a direction parallel to a side of the chamfered surface which is closest to the line segment is 50 nm or less.

2. A glass substrate for a mask blank, comprising two main surfaces facing each other and chamfered surfaces provided at peripheries of the two main surfaces, wherein
a flatness of each of the two main surfaces is 100 nm or less, and
on the chamfered surfaces surrounding the each of the two main surfaces and being other than corner portions which are 10 mm or less apart from outer corners of the chamfered surface in a plan view of the glass substrate, a waviness measured along a line segment having a length of 2 mm in a direction parallel to a side of the chamfered surface which is closest to the line segment is 50 nm or less.

3. The glass substrate according to claim 1, wherein the flatness of the at least one of the main surfaces is 50 nm or less.

4. The glass substrate according to claim 1, wherein the flatness of the at least one of the main surfaces is 30 nm or less.

5. The glass substrate according to claim 1, wherein the glass substrate has a coefficient of thermal expansion at 20° C. of 600 ppb/° C. or less.

6. The glass substrate according to claim 1, wherein the glass substrate has a coefficient of thermal expansion at 20° C. of 400 ppb/° C. or less.

7. The glass substrate according to claim 1, wherein the glass substrate has a coefficient of thermal expansion at 20° C. of 100 ppb/° C. or less.

8. The glass substrate according to claim 1, wherein the glass substrate has a coefficient of thermal expansion at 20° C. of 30 ppb/° C. or less.

9. The glass substrate according to claim 2, wherein the flatness of the each of the two main surfaces is 50 nm or less.

10. The glass substrate according to claim 2, wherein the flatness of the each of the two main surfaces is 30 nm or less.

11. The glass substrate according to claim 2, wherein the glass substrate has a coefficient of thermal expansion at 20° C. of 600 ppb/° C. or less.

12. The glass substrate according to claim 2, wherein the glass substrate has a coefficient of thermal expansion at 20° C. of 400 ppb/° C. or less.

13. The glass substrate according to claim 2, wherein the glass substrate has a coefficient of thermal expansion at 20° C. of 100 ppb/° C. or less.

14. The glass substrate according to claim 2, wherein the glass substrate has a coefficient of thermal expansion at 20° C. of 30 ppb/° C. or less.

15. A method for producing a glass substrate for a mask blank, the method comprising:

scanning a main surface of the glass substrate by moving a local processing tool whose unit processing area is smaller than an area of the main surface of the glass substrate, thereby processing the main surface; and thereafter polishing a surface to be chamfered provided at a periphery of the main surface so that a polishing amount is 200 nm thick or more; and polishing the main surface with a polishing pad whose contact area in polishing is larger than the area of the main surface and a polishing slurry so that a polishing amount is 200 nm thick or more and 2000 nm thick or less.

* * * * *